(12) United States Patent
Steff De Verninac et al.

(10) Patent No.: US 10,280,585 B2
(45) Date of Patent: May 7, 2019

(54) METHOD AND FACILITY FOR MANUFACTURING A CONTINUOUS WALL IN THE GROUND

(71) Applicant: SOLETANCHE FREYSSINET, Rueil Malmaison (FR)

(72) Inventors: Bertrand Steff De Verninac, Rueil Malmaison (FR); Sabine Darson-Balleur, Rueil Malmaison (FR); Florence Renalier, Rueil Malmaison (FR); Michel Coudry, Rueil Malmaison (FR)

(73) Assignee: SOLETANCHE FREYSSINET, Rueil Malmaison (FR)

( * ) Notice: Subject to any disclaimer, the term of this patent is extended or adjusted under 35 U.S.C. 154(b) by 0 days.

(21) Appl. No.: 14/896,703

(22) PCT Filed: Jun. 11, 2014

(86) PCT No.: PCT/FR2014/051412
§ 371 (c)(1),
(2) Date: Dec. 8, 2015

(87) PCT Pub. No.: WO2014/199078
PCT Pub. Date: Dec. 18, 2014

(65) Prior Publication Data
US 2016/0145825 A1    May 26, 2016

(30) Foreign Application Priority Data

Jun. 12, 2013    (FR) ...................................... 13 55437

(51) Int. Cl.
*E02D 17/18* (2006.01)
*E02D 29/02* (2006.01)
(Continued)

(52) U.S. Cl.
CPC ............. *E02D 29/05* (2013.01); *E02D 17/13* (2013.01); *E02D 17/18* (2013.01); *E02D 29/02* (2013.01);
(Continued)

(58) Field of Classification Search
CPC .................................. E02D 5/18; E02D 17/13
See application file for complete search history.

(56) References Cited

U.S. PATENT DOCUMENTS 3,727,332 A * 4/1973 Zimmer .................... E02F 3/18
172/4.5
3,893,302 A * 7/1975 Peterson ................. E02D 5/187
37/355
(Continued)

FOREIGN PATENT DOCUMENTS

FR    2211027 A5    7/1974
FR    2891287 A     3/2007

*Primary Examiner* — Benjamin F Fiorello
(74) *Attorney, Agent, or Firm* — MH2 Technology Law Group, LLP (57) ABSTRACT

The invention relates to an installation (10) for making a continuous wall in ground (S), the installation comprising:
an excavation machine (14) having a frame (16) with a bottom end (16b);
determination means (80) for periodically determining the offset between the frame and a first screen while making a second screen in the ground juxtaposed with the first screen; and
correction means (50) for periodically correcting the position of the frame (16) so as to reduce the offset as determined by the determination means between the frame (16) and the first screen (E1), and maintain overlap between the longitudinal side of the frame and the longitudinal side of the first screen in such a manner that the second screen is secant with the first screen (Continued)

(E1) over the entire length of the shorter of the first and second screens, thereby forming the wall that is continuous.

17 Claims, 9 Drawing Sheets

(51) Int. Cl.
| | |
|---|---|
| *E02D 29/05* | (2006.01) |
| *E02D 17/13* | (2006.01) |
| *E02F 1/00* | (2006.01) |
| *G01R 29/08* | (2006.01) |
| *G01R 29/12* | (2006.01) |
| *G01R 29/24* | (2006.01) |
| *G01R 33/02* | (2006.01) |

(52) U.S. Cl.
CPC ............ *E02F 1/00* (2013.01); *G01R 29/0878* (2013.01); *G01R 29/12* (2013.01); *G01R 29/24* (2013.01); *G01R 33/02* (2013.01)

(56) References Cited

U.S. PATENT DOCUMENTS

| | | | | |
|---|---|---|---|---|
| 4,379,658 | A * | 4/1983 | Schmednecht | E02D 5/187 37/347 |
| 7,010,873 | B2 * | 3/2006 | Kinoshita | E02F 5/06 37/352 |
| 2009/0158623 | A1 * | 6/2009 | Chagnot | E02D 5/18 37/94 |
| 2010/0108392 | A1 * | 5/2010 | Ressi di Cervia | E02D 5/187 175/61 |

* cited by examiner

METHOD AND FACILITY FOR MANUFACTURING A CONTINUOUS WALL IN THE GROUND

BACKGROUND OF THE INVENTION

The present invention relates to the field of boring and excavating screens in ground. A particular application is to be found in the context of making works that are very deep, in particular having a depth of more than about fifty meters.

The term "screen" is used particularly, but not exclusively, to mean diaphragm walls that are molded in the ground.

More particularly, the invention relates to a method of making a continuous wall in ground, the method comprising the following steps:

providing an excavation machine having a frame with a longitudinal direction, said frame having a bottom end and carrying a cutter device arranged at its bottom end;

performing a step of making a first screen in the ground, which step includes a first boring step using the excavation machine; and performing a second boring step using the excavation machine in order to make a second screen in the ground that is juxtaposed with the first screen in such a manner that the first and second screens are secant.

The excavation machine used in the method is generally a rotary drum borer, as described in FR 2 211 027. The machine is suspended from a hoist by cables.

During the first boring step, the frame moves downwards as its cutter device digs the trench.

For certain works, the trench may present great depth, which may extend to one hundred meters or more.

In addition, it is generally necessary for the trench to be very accurate in terms of its verticality, in particular since the final wall is the result of juxtaposing secant screens.

Nevertheless, because of the presence of irregularities in the ground, there are major risks of the frame departing from its vertical path, with this risk being even greater for works of great depth.

There is thus a major risk of the final wall not being continuous, or of being secant only over an overlap thickness that is not sufficient.

Insofar as the final wall usually needs to be waterproof, it can be understood that there exists a real need to be able to ensure that the wall that is made is indeed continuous.

In order to solve this problem, in particular in the context of boring to great depths, it is known to increase the thickness of the screen. Nevertheless, that solution leads to a significant increase in the resources that are consumed and in the cost of making the continuous wall, and that is not desirable.

OBJECT AND SUMMARY OF THE INVENTION

An object of the invention is to remedy the above-mentioned drawbacks by proposing a method of making a continuous wall in ground, which method makes it possible to ensure that the wall is continuous, in particular in the context of walls of great depth.

The invention achieves this object by the fact that, during the second boring step, the following steps are performed:

periodically determining the offset between the frame and the first screen; and periodically correcting the position of the frame so as to reduce the previously determined offset and maintain overlap between the longitudinal side of the frame and the longitudinal side of the first screen, in such a manner that the second screen is secant with the first screen over the entire length of the shorter of the first and second screens, thereby forming the wall that is continuous.

The term "length" is used of the first or second screen to mean the longest dimension of said screen. The term "width" is used to mean the longer of the dimensions of the screen after its length, and the term "thickness" is used to mean the smallest of its three dimensions.

Furthermore, in the meaning of the invention, the term "first screen" covers equally well a concrete wall element, e.g. a molded wall, and a region of excavation element that is filled with drilling mud.

The term "secant" is used to mean that the first and second screens have an intersection in common, this intersection being constituted by the overlap of the longitudinal side of the first screen and the facing longitudinal side of the second screen. This overlap extends over a thickness considered in a horizontal plane referred to as the overlap thickness. In the invention, it is desired to maintain an overlap thickness that is non-zero and preferably greater than a predetermined threshold, which may be a function of the thickness of the first screen, for example.

Thus, in the meaning of the invention, the path followed by the frame in the ground is a function of the shape and of any deflection of the first screen that has already been made. In other words, the second screen is itself made relative to the first screen, taking account of the orientation and of any deflection of the already-made first screen, with this being in order to ensure continuity of the side-against-side juxtaposition of the screen, and with this extending over the entire length of the shorter of the first and second screens.

It can be understood that the wall-making method of the invention seeks firstly to maintain the overlap between the longitudinal side of the frame and the facing longitudinal side of the first screen in order to guarantee continuity between the first and second juxtaposed screens, even though the resulting continuous wall is not purely vertical. While making the second screen, the previously made first screen is thus used as a reference or guide for the movement of the frame.

Consequently, the second screen is made as parsimoniously as possible so there is no need to overdimension the thickness of the screen.

Preferably, the periodic correction consists in eliminating the offset determined between the frame and the first screen. This ensures perfect continuity between the first and second screens.

Nevertheless, and without going beyond the ambit of the present invention, the correction could consist in no more than reducing the offset, as determined between the frame and the first screen, but without eliminating it. One advantage of that is to reduce, where possible, any deflection of the second screen from the vertical, while nevertheless, preserving continuity of the wall. In any event, in order to ensure continuity between the two screens, the component of the offset considered in a direction perpendicular to the mean surface of the first screen must remain strictly less than the thickness of the screens.

It is preferable to seek to minimize this offset so that the overlap thickness is not less than a predetermined minimum thickness, e.g. 60% of the thickness of the screen.

Also, and in advantageous manner, the position of the frame is corrected so that the overlap thickness is not less than said predetermined minimum thickness.

Advantageously, the step of determining the offset between the frame and the first screen is performed once every 30 minutes (min) to 60 min, or once every 1 meter (m) to 5 m. Preferably, the offset is determined in real time.

This step of determining the offset between the frame and the first screen is performed by measuring the position of the frame relative to the already-made first screen.

To do this, during the second boring step, a physical magnitude is preferably measured periodically using the frame, and the offset between the frame and the first screen is determined from the measured values of said physical magnitude.

In order to perform the correction step, the frame is advantageously provided with path correction means that are known from elsewhere. By way of example, they may be bearing skids that are actuated by hydraulic actuators mounted on the longitudinal faces and sides of the frame. On being actuated, the skids bear against the faces of the trench so as to modify the position of the frame in the trench.

Advantageously, the physical magnitude is measured continuously so that the offset is determined in real time. Preferably, the offset, or else a graphical representation of said offset, is displayed in real time in the cabin of the machine or at any other control position of the worksite.

In a first implementation, at least one electrode is placed in the first screen; during the second boring step, a physical magnitude is measured from the longitudinal side of the frame that faces the longitudinal side of the first screen, and the offset between the frame and the first screen is determined from the measured physical magnitude values.

Preferably, the measured physical magnitude is an electric potential.

Thus, in the first implementation, the electric potential of the longitudinal side of the frame facing the longitudinal side of the first screen is measured periodically in order to determine the offset between the frame and the first screen. In practice, it is found that the measured electric potential decreases when the frame moves away from the first screen.

Preferably, the electrode extends over all or part of the length of the first screen.

Also preferably, in order to improve measurement accuracy, a plurality of electrodes are placed in the first screen, the electrodes being arranged in a row that extends across the thickness of the first screen, and the electrodes are set to a predetermined potential.

In a variant of the first implementation, at least one metal part is placed in the first screen while it is being made, said metal part extending along the length of the first screen; the frame is provided with a measuring appliance, and, during the second boring step, the offset between the frame and the first screen is determined from values measured by the measuring appliance.

Preferably, the metal part is a reinforcing cage that is embedded in the first screen, and the measuring appliance is an appliance for measuring an electric field, an electromagnetic field, or a magnetic field. By way of example, the appliance may be a radar antenna or indeed it may be a device made up of one or more electrodes.

Preferably, a plurality of metal parts are placed in the first screen, the metal parts being arranged in a row that extends across the thickness of the first screen, and the metal parts are preferably, but not necessarily, set to a determined potential. This plurality of metal parts preferably forms the above-mentioned reinforcing cage.

In a second implementation, which may be combined with the first implementation, the first screen is made from a mixture of hydraulic binder and a marker; during the second boring step, the presence of the marker is detected by using at least one detector arranged in the frame, and the offset between the frame and the first screen is determined from the values supplied by the detector.

Preferably, the marker is a radioactive element, e.g. potassium chloride, thorium, rubidium, or any other radioactive source. In another variant, the marker is a powdery metal element, such as for example powder, or fiber, or indeed metal filings. For example, it may be iron powder or powder of any other type of element that can be mixed with the binder.

Advantageously, the detector is for detecting gamma rays when a radioactive source is mixed with the binder. It could also be a detector that is configured for measuring resistivity, polarization, or indeed electric field or electromagnetic field in the material constituting the first screen.

In order to improve the accuracy of results, the longitudinal side of the frame is provided with at least one strip of detectors that extend over all or part of the thickness of the frame and possibly over the other faces of the frame.

In a third implementation, which may be combined with at least one of the above-mentioned implementations, the longitudinal side of the frame is provided with sensors capable, during the second boring step, of measuring the electrical resistivity or the mechanical strength of the medium in contact with the sensors; the offset between the frame and the first screen being determined from the measurements supplied by the sensors.

These sensors are configured to identify and distinguish between the materials constituting the medium in contact with the sensors. By way of example, these materials may be liquid, concrete, or ground.

In order to measure electrical resistivity, the sensors used are electrodes, whereas in order to measure mechanical strength, it is possible to use feelers configured to come into contact with the face of the trench.

In a fourth implementation, which may be combined with at least one of the above-mentioned implementations, the frame includes wave emitter and receiver sources that are arranged on either side of the thickness of the frame; during the second boring step, the wave emitter and receiver sources emit waves towards the first screen and then measure the reflected waves, and the offset between the frame and the first screen is determined from the measurements supplied by the wave emitter and receiver sources.

The wave emitter and receiver sources can view the surrounding medium "blind". Preferably, an acoustic imaging method is used.

In a fifth implementation, which may be combined with at least one of the above implementations, at least one longitudinal cavity is arranged in the first screen, and, during the second boring step, an emitter or a receiver as the case may be is lowered down the cavity at a speed identical to the downward speed of the frame, said frame being fitted with a receiver or with an emitter as the case may be; the emitter emits a signal that is received by the receiver, and the offset between the frame and the first screen is determined from the signal received by the receiver.

Advantageously, the signal is an electrical or an electromagnetic or a magnetic signal. Alternatively, the signal is an X-ray signal.

Preferably, the longitudinal cavity is constituted by a hollow part placed in the first screen while it is being made. This hollow part is preferably constituted by a hollow tube extending along all or part of the length of the first screen. The position of the longitudinal cavity relative to the first screen is known.

In a sixth implementation, which may be combined with at least one of the above-described implementations, at least one longitudinal cavity is arranged in the ground in the vicinity of the first screen, and during the second boring step, an emitter or a receiver as the case may be is lowered down the cavity at a speed identical to the downward speed of the frame, said frame being fitted with a receiver or with an emitter as the case may be; the emitter emits a signal that is received by the receiver and wherein the offset between the frame and the first screen is measured from the signal received by the receiver. The XYZ position of said at least one cavity is known.

Preferably, a plurality of cavities, all of known positions, are used for positioning the frame relative to the first screen. These cavities are preferably disposed on both sides of the screen.

The invention also provides an installation for making a continuous wall in ground, for performing the method of the invention, which installation comprises:

means for making first and second screens in the ground, which means comprise an excavation machine having a frame with a bottom end and carrying a cutter device arranged at its bottom end;

means for periodically determining the offset between the frame and the first screen while making the second screen in the ground; and correction means for periodically correcting the position of the frame so as to reduce the offset as determined between the frame and the first screen, and maintain overlap between the longitudinal side of the frame and the longitudinal side of the first screen in such a manner that the second screen is secant with the first screen over the entire length of the shorter of the first and second screens, thereby forming the wall that is continuous.

The means for periodically determining the offset between the frame and the first screen correspond in particular to the means as defined above.

The correction means preferably comprise hydraulic skids mounted on the frame and configured to bear against and thrust on the faces of the trench, for the purpose of modifying the path followed by the frame. The path followed by the frame is modified so as to reduce or eliminate the offset as determined between the facing longitudinal sides of the frame and of the first screen.

BRIEF DESCRIPTION OF THE DRAWINGS

The invention can be better understood on reading the following description of embodiments of the invention given as non-limiting examples with reference to the accompanying drawings, in which.

DETAILED DESCRIPTION OF THE INVENTION

Figure 1:
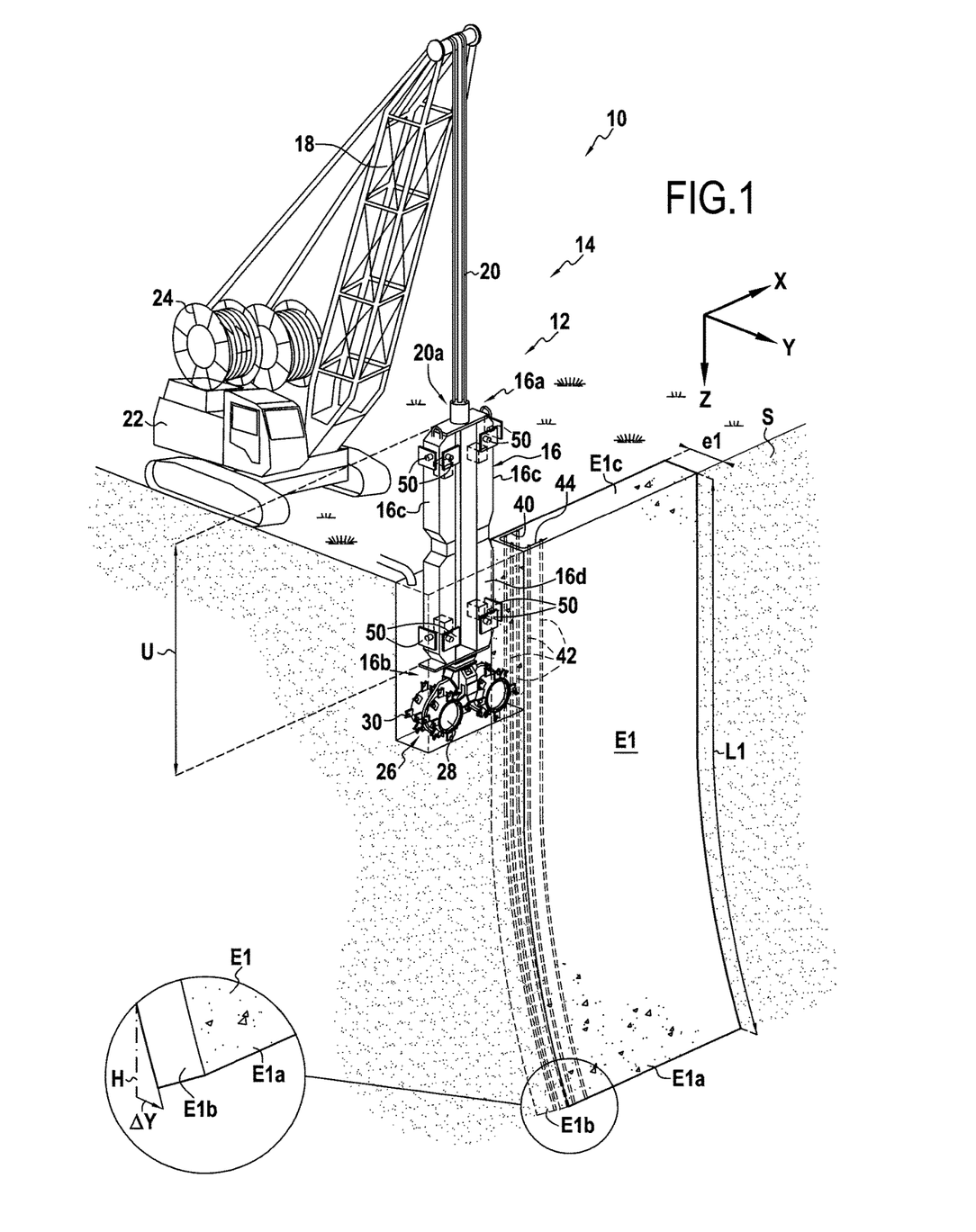
FIG. 1 is a view of an installation of the invention for making a continuous wall by performing the method in an implementation of the invention, the excavation machine being shown beginning boring of the second screen and the first screen being shown provided with electrodes.

FIG. 1 shows a first embodiment of an installation 10 for making a continuous wall in ground S in accordance with the present invention. This installation 10 is for performing the method of the invention as described below.

The installation 10 comprises means 12 for making screens in the ground, the means comprising an excavation machine 14 including a frame 16. In this example, the frame is suspended from the top end of a mast 18 by support cables 20.

The mast 18 is connected to a movable carrier 22. The cables 20 are connected in conventional manner to winders 24 mounted on the carrier 22.

The frame 16 has a top end 16a that is connected to the bottom ends 20a of the support cables 20, and a bottom end 16b that carries a cutter device given reference 26.

In this example, the cutter device 26 is constituted by two rotary drums 28 having cutter teeth 30 and with axes of rotation that extend transversely relative to the longitudinal direction U of the frame 16.

As can be seen in FIG. 1, the excavation machine 14 is configured to dig an excavation in the ground that extends in a direction that is substantially vertical.

In the description below, reference is made to an XYZ reference frame as shown in FIG. 1, where Z represents the vertical direction, X a horizontal direction that extends along the width of the screen, and Y another horizontal direction that is orthogonal to the directions X and Z.

In the example of FIG. 1, a first screen E1 has already been made in the ground using the excavation machine 14. In this example, the first screen E1 is a diaphragm wall molded in the ground. In order to make it, and in conventional manner, an excavation was dug using the excavation machine 14 while injecting drilling mud, after which a reinforcing cage 40 was inserted in the excavation prior to filling the excavation with concrete while removing the drilling mud. In conventional manner, the reinforcing cage 40 is constituted by longitudinal metal bars 42 that extend over substantially the entire length L1 of the first screen E1. The bars 42 are connected to one another by cross-bars 44.

It is specified at this point that the length L1 of the first screen E1 corresponds to its longest dimension.

In this example, the first screen E1 is made to a great depth, greater than 50 m. Insofar as the ground S is not uniform, and presents certain irregularities, it can be seen that the first screen E1 is not purely vertical. Naturally, the deflection shown in FIG. 1 is exaggerated.

In this example, the deflection $\Delta Y$ at the bottom end E1$a$ of the first screen E1 in the direction Y is about 0.30 m.

Naturally, the greater the length L1 of the first screen E1, the greater the risk of the deflection $\Delta Y$ being large.

In FIG. 1, it can be seen that the longitudinal side E1$b$ of the first screen E1 presents a profile that is slightly curved, the deflection of the first screen E1 being directed in the Y direction, as mentioned above.

In the example of FIG. 1, the excavation machine 14 is shown making a second borehole in order to make a second screen E2 in the ground S that is juxtaposed and secant with the already made first screen E1.

Figure 4:
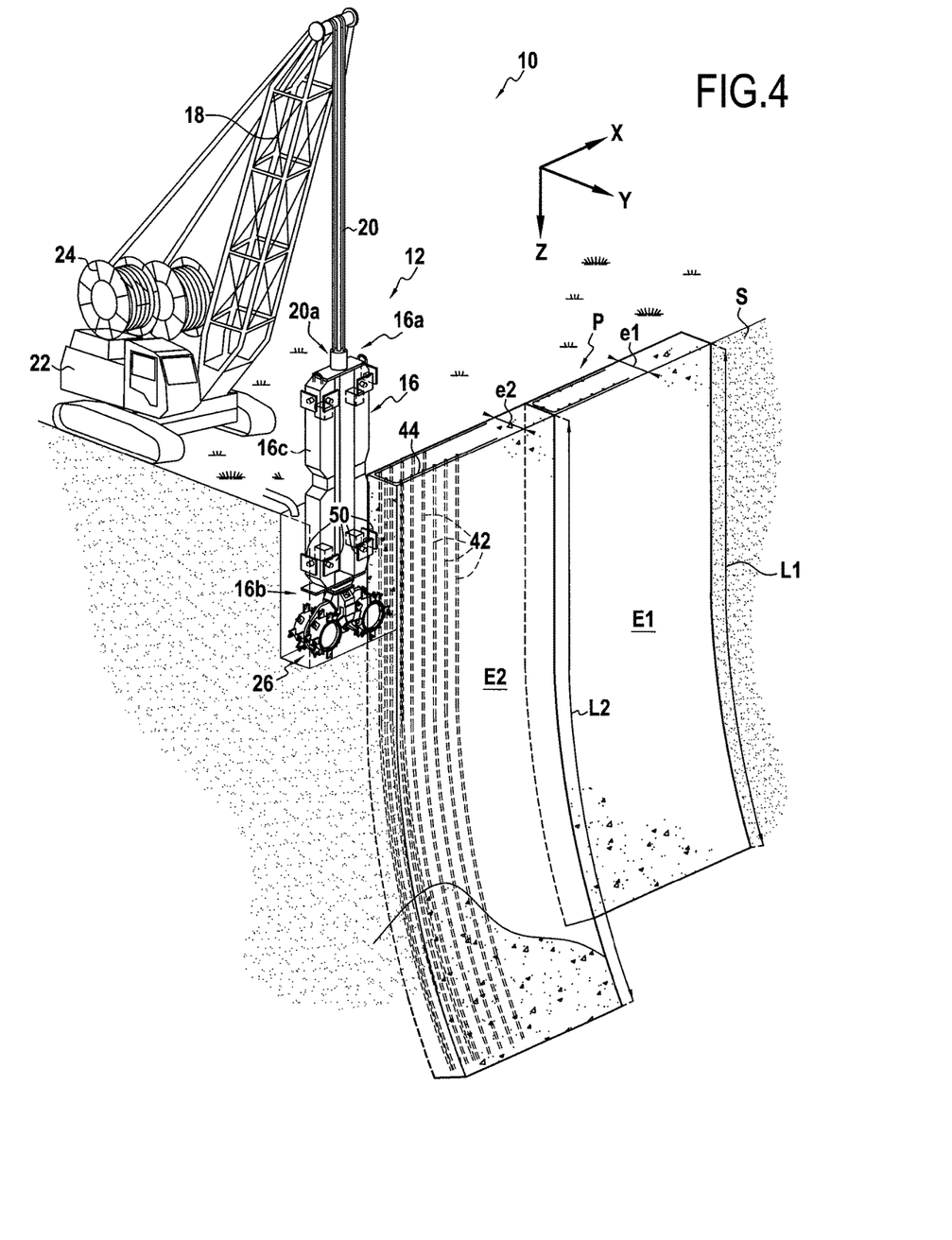
FIG. 4 shows the juxtaposed and secant first and second screens forming a continuous wall.

As can be understood from FIG. 4, the second screen E2 is made so as to be juxtaposed with the first screen E1 in such a manner that the first and second screens are secant, so as to make a continuous wall P in the ground S.

In this non-limiting example, the second screen E2 that is to be made presents a length L2 that is strictly longer than the length L1 of the previously made first screen E1; the thicknesses e1 and e2 of the first and second screens E1 and E2 are substantially equal.

The frame 16 has two longitudinal sides 16$c$ that extend parallel to the longitudinal direction U of the frame 16, on either side of the width of the frame. The term "width" is used of the frame to mean the dimension of the frame that is smaller than the length or height of the frame but greater than its thickness. In this example, the width of the frame 16 extends along the X axis of the above-defined reference frame.

In accordance with the invention, after the first screen E1 has been made, a second boring step is performed as shown in FIG. 1, during which an offset $\delta$, if any, between the frame 16 and the first screen E1 is determined periodically.

In the XYZ reference frame, this offset $\delta$ has components $\delta x$ and $\delta y$, these components being defined along the above-defined axes X and Y.

In other words, this offset $\delta$ corresponds to the distance between the frame and the first screen as measured along the direction X, and/or the movement of the frame relative to the first screen in the direction Y.

In the example of FIG. 1, the second boring step is performed while biting into the transverse end E1$c$ of the first screen E1 so that in this non-limiting example attention is given only to the offset $\delta y$ corresponding to a transverse shift of the plane in which the frame extends relative to the mean surface of the first screen E1. In a variant, it is verified that the first screen has indeed been bitten into, e.g. by monitoring the position of the frame and the values of the torques exerted by the motors for rotating the drums. It is thus ensured that the offset $\delta x$ remains negative. If this is not true, the position of the frame is corrected. Preferably but not necessarily, the offset $\delta y$ is determined continuously or periodically, e.g. by performing a measurement cycle once every 30 min.

Preferably, this offset is measured between a point of the frame 16 and the first screen E1. In a variant, this offset is determined between a plurality of points of the frame and the first screen E1, and then the offsets that have been determined are averaged in order to obtain an average offset between the frame and the first screen. In another variant, this offset is determined between one or more points of the frame and one or more elements in the surrounding ground S.

In accordance with the invention, when an offset $\delta y$ is determined, the position of the frame 16 is corrected periodically in order to reduce the offset $\delta y$ so as to maintain an overlap thickness K between the longitudinal edge E1$b$ of the first screen and the longitudinal edge 16$c$ of the frame 16. The correction is performed in such a manner that the overlap thickness K is not less than a predetermined minimum thickness, e.g. 60% of the thickness of the frame.

In this non-limiting example, insofar as the thickness of the frame 16 is substantially equal to the thickness of the second screen, it can be understood that this correction serves to maintain overlap between the longitudinal edges of the first and second screens E1 and E2. This makes it possible to ensure that the second screen E2 continues to be secant with the first screen E1 over the entire length L1 of the shorter of the first and second screens, E1 of the first screen which is the shorter screen, thereby ensuring continuity between the first screen E1 and the second screen E2.

Consequently, the juxtaposition of the first and second screens E1 and E2 forms a wall element that is continuous. It can be understood that the continuity extends from the overlap of the longitudinal sides of the first and second screens along the shorter of the lengths of the juxtaposed first and second screens. This continuity is clearly visible in FIG. 4, which shows the first and second screens E1 and E2 in juxtaposition.

In order to make this periodic correction, the frame 16 is advantageously provided with bearing skids 50 that are arranged on the longitudinal faces 16 of the frame and on the longitudinal sides 16$c$ of the frame 16. These skids are actuated by actuators so as to bear against the face of the trench that is being excavated, thereby having the effect of modifying the path followed by the frame.

The correction is preferably performed each time that an offset is determined. Without going beyond the ambit of the present invention, it is nevertheless possible to make provision for some other periodicity.

Figure 2:
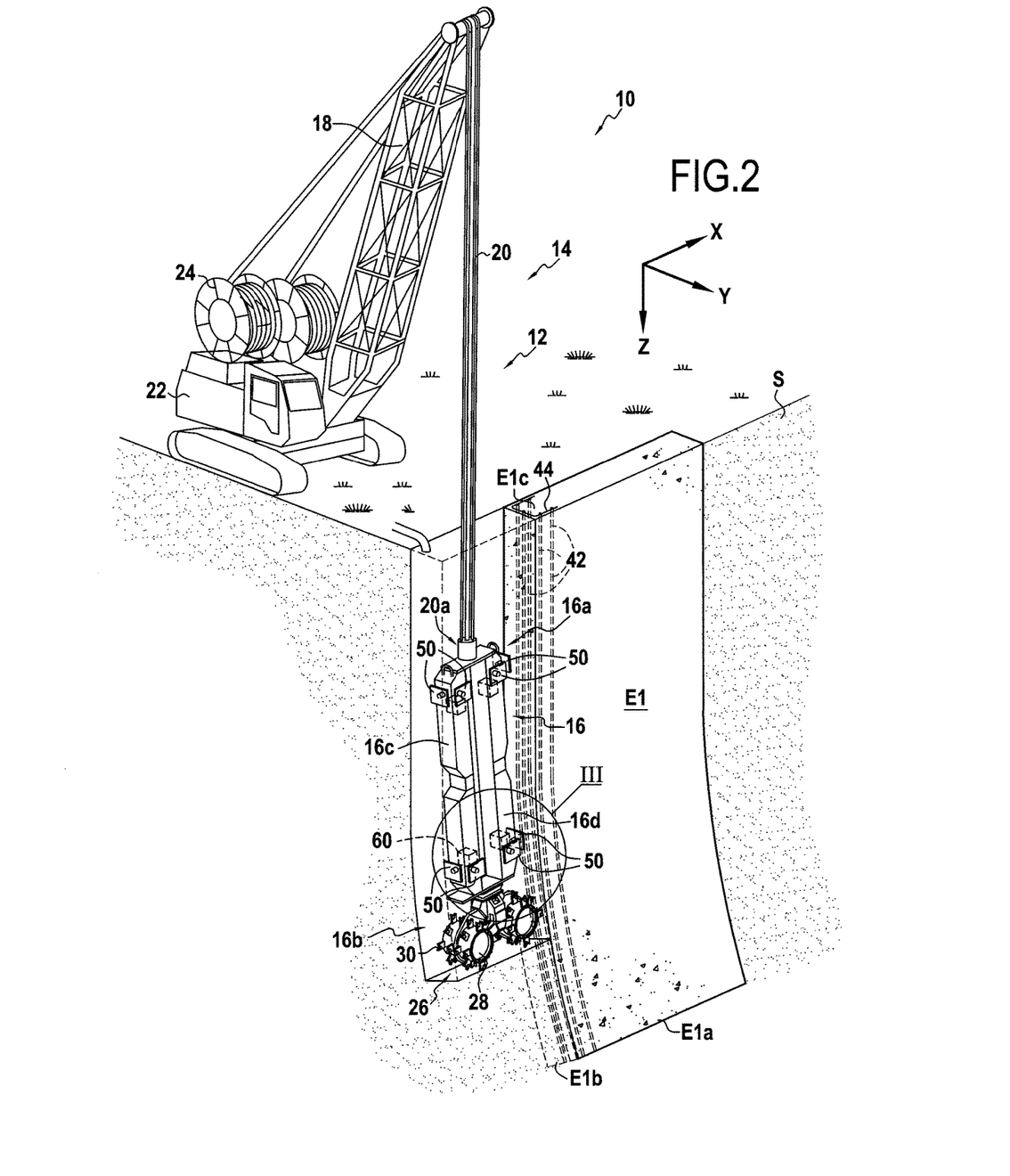
FIG. 2 is a view of the FIG. 1 installation in which the path followed by the frame has been corrected to follow the curvature of the first screen.

FIG. 2 shows the frame 16 after its position has been corrected by the skids 50 as a result of an offset being determined between the frame and the first screen E1. It can thus be understood, on referring to FIG. 2, that the effect of the correction step is to modify the path followed by the frame in such a manner as to follow the deflection of the longitudinal side E1$b$ of the first screen E1. The longitudinal side of the frame thus remains in contact with the longitudinal side of the first screen, while continuing to bite into it so as to ensure continuity along the axis X. In other words, the position of the frame is corrected so that the longitudinal side of the frame continues to face the longitudinal side E1$b$ of the first screen E1 so that the excavation and subsequently the screen E2 are arranged in continuity with the first frame E1, with this continuing over the entire length of the shorter of the two screens.

Figure 3:
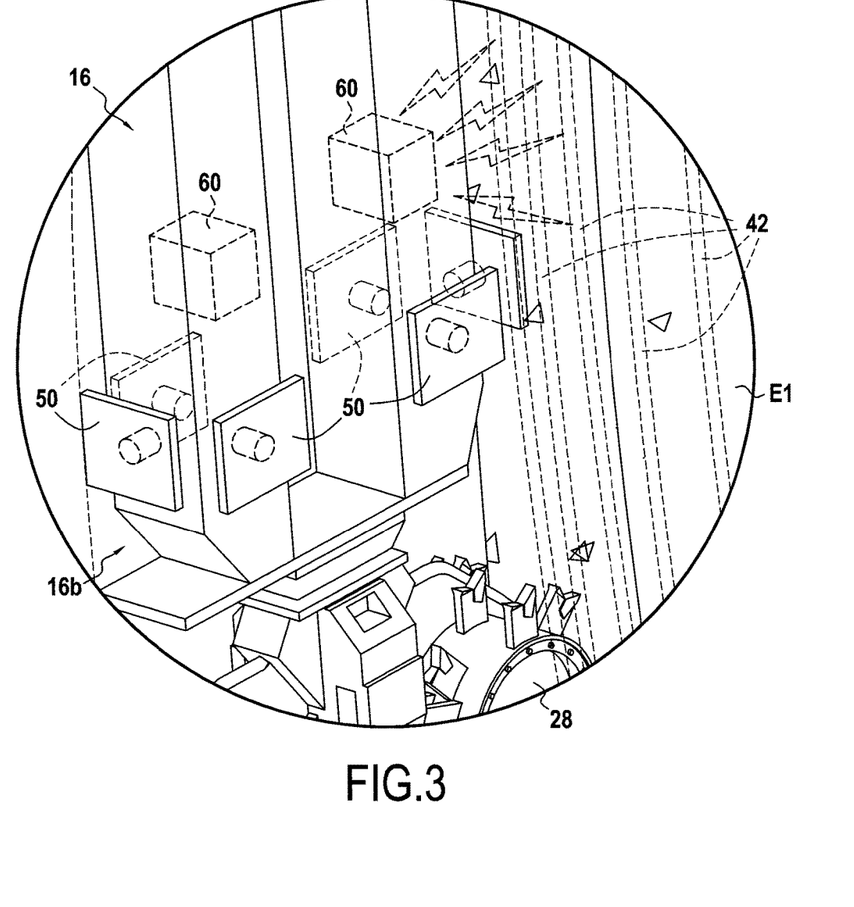
FIG. 3 is a detail view showing an example of means for determining the offset between the frame and the first screen.

The skids 50 can be seen more clearly in FIG. 3 which is a detail view of the bottom end 16$b$ of the frame 16.

In this example, the second boring step is performed while injecting drilling mud. Thereafter, after boring, the excavation is filled with concrete while removing the drilling mud. A reinforcing cage may also be inserted into the excavation prior to injecting concrete.

There follows a more detailed explanation of how the offset δ between the frame 16 and the first screen is determined.

In an advantageous aspect of the invention, a physical magnitude is periodically measured during the second boring step, and the offset between the frame 16 and the first screen E1 is determined on the basis of the measured values of said physical magnitude.

Attention is preferably given to variations in the physical magnitude that are likely to occur during the second drilling step. Consequently, the variations in the physical magnitude are considered as corresponding to the appearance of an offset δ between the frame and the first screen.

Advantageously, the physical magnitude is measured using sensors 60 that are arranged on the frame 16, as can be seen in FIG. 3.

By way of example, the physical magnitude is an electric, electromagnetic, or magnetic field. A variation in this field as the frame is moving downwards is interpreted as indicating that the frame has moved away from the first screen E1.

Some of the skids 50 are then actuated in order to correct the position of the frame in order to reduce or eliminate the offset that has been determined.

With reference to FIGS. 1, 2, 3, 6A, and 6B, there follows a description of a first implementation of the method of the invention.

In the first implementation, at least one electrode is placed in the first screen E1, and preferably a plurality of electrodes. In this example, the electrodes are constituted by the longitudinal metal bars referenced 42 that form part of the reinforcing cage in this example.

Without going beyond the ambit of the present invention, the electrodes could be constituted by other metal parts, such as for example longitudinal metal bars that are preferably arranged in a row that extends across the thickness of the first screen E1 and that are not connected to one another for the purpose of forming a reinforcing cage.

Advantageously, the electrodes 42 are set at one or more predetermined potentials, e.g. 0 volts (V), or ±50 V. In the first implementation, during the second boring step, a physical magnitude is measured of the longitudinal side 16c of the frame 16 that is facing the longitudinal side E1a of the first screen E1. The offset between the frame 16 and the first screen E1 is determined from the values of the measured physical magnitude. In this example, the measured physical magnitude is an electric potential.

Figure 6A:
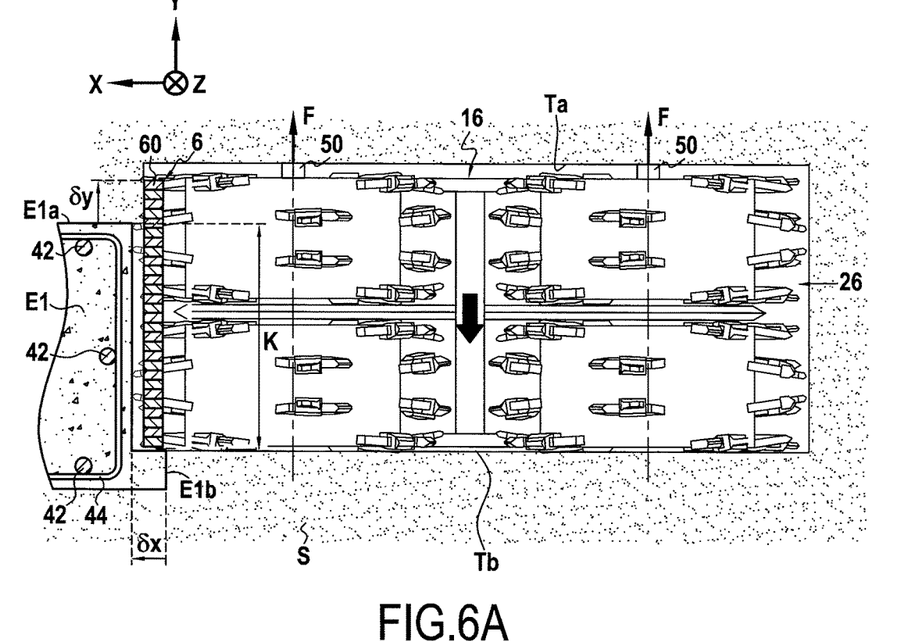
FIG. 6A is a cross-section view of the frame and of the first screen provided with a reinforcing cage, this figure showing diagrammatically the positions of the sensors on the frame in an embodiment of the installation of the invention.

FIG. 6A is a diagrammatic plan view showing the cutter device carried by the frame 16, together with the positions of the sensors 60 that are fastened to the frame. Reference K corresponds to the overlap thickness between the first screen and the second screen that is being constructed.

As can be seen from FIG. 6A, the sensors 60 extend along the thickness of the frame 16 from the longitudinal side 16c of said frame 16. The sensors could equally well be positioned on the faces 16d of the frame.

In the example of FIG. 6A, the sensors 60 are in alignment so as to form a strip of sensors; each of the sensors 60 is configured to measure an electric potential. The result of these measurements is displayed on a screen 70 in the form of a bar chart, where each bar 72 is associated with a respective one of the sensors 60.

Figure 6B:
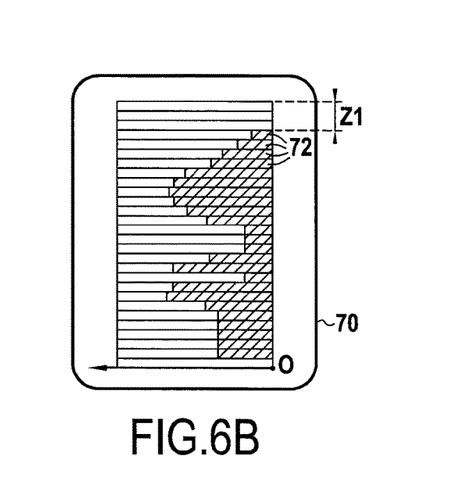
FIG. 6B shows the graphical data that appears on the monitor screen connected to the sensors of the FIG. 6A frame.

In this chart, it can be seen that the electric field is not at a maximum for the sensors in the middle and at the ends (theoretical positions of the metal reinforcement), but that these maxima are offset along the strip of sensors. It can be deduced therefrom that the frame is no longer in alignment with the longitudinal side E1a of the first screen E1. An offset δy has thus been found to exist and it is located by the shift of the maxima.

The bearing skids 50 on the face of the frame that has gone beyond the face of the first screen E1 are actuated so as to generate a thrust force F on the face Ta of the trench in order to reduce the offset δy that has been determined. In response, this thrust F has the effect of moving the frame 16 in the direction opposite to the direction of the thrust force. This serves to correct the position of the frame, thereby increasing the overlap area between the longitudinal side of the frame and the longitudinal side of the first screen, thus ensuring continuity between the first and second screens.

In this example, the correction of the position of the frame is performed in real time in automatic or manual manner by using the signals measured by the sensors 60.

Figure 7A:
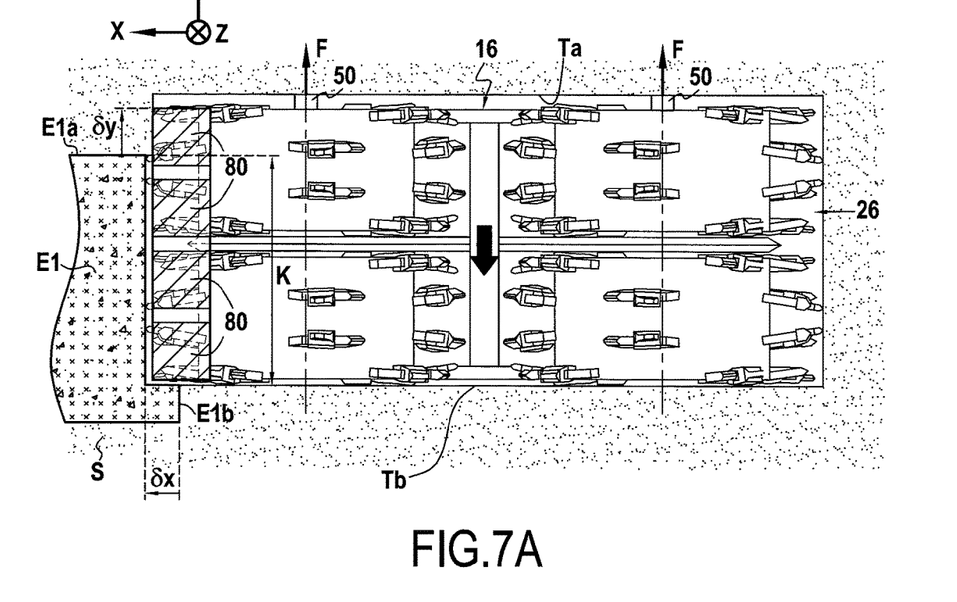
FIG. 7A shows a variant of the FIG. 6A installation, the first screen being constituted by a mixture of binder and a radioactive marker, while the frame is provided with gamma ray detectors.
Figure 7B:
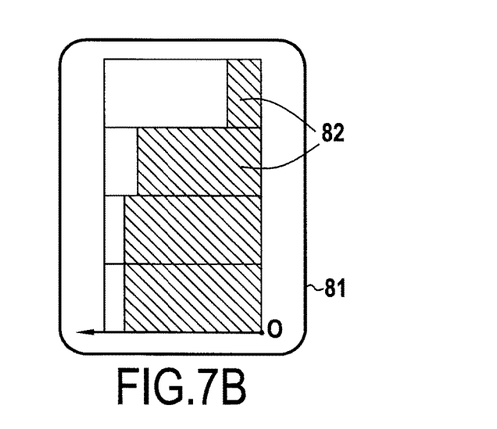
FIG. 7B shows the graphical data that appears on the monitor screen connected to the detectors of the FIG. 7A frame.

With reference to FIGS. 7A and 7B, there follows a description of a second implementation of the method of the invention.

In this second implementation, a first screen E1 is made using a mixture of a hydraulic binder and a marker.

In this example, the hydraulic binder is a concrete slurry, while the marker is a radioactive source, specifically potassium chloride. Nevertheless, this marker could be replaced, e.g. with metallic elements (e.g. iron powder) or any other element suitable for constituting a marker.

In the method, during the second boring step, the presence of the marker is detected using a plurality of detectors 80, specifically gamma ray detectors that are configured to detect radioactive emissions. In this method, the offset δy between the frame 16 and the first screen E1 is determined from the values supplied by the detectors 80. These values are preferably displayed on a screen 81 in the form of a bar chart. Each bar 82 represents the intensity of the signal received by a corresponding detector 80. It can be seen once more that the frame 16 has been subjected to deflection in the Y direction and it presents an offset δy relative to the first screen E1. Once more, as in the first implementation, the bearing skids 50 are actuated so as to correct the position of the frame 16 in order to reduce the offset δy that has been determined.

Figure 8A:
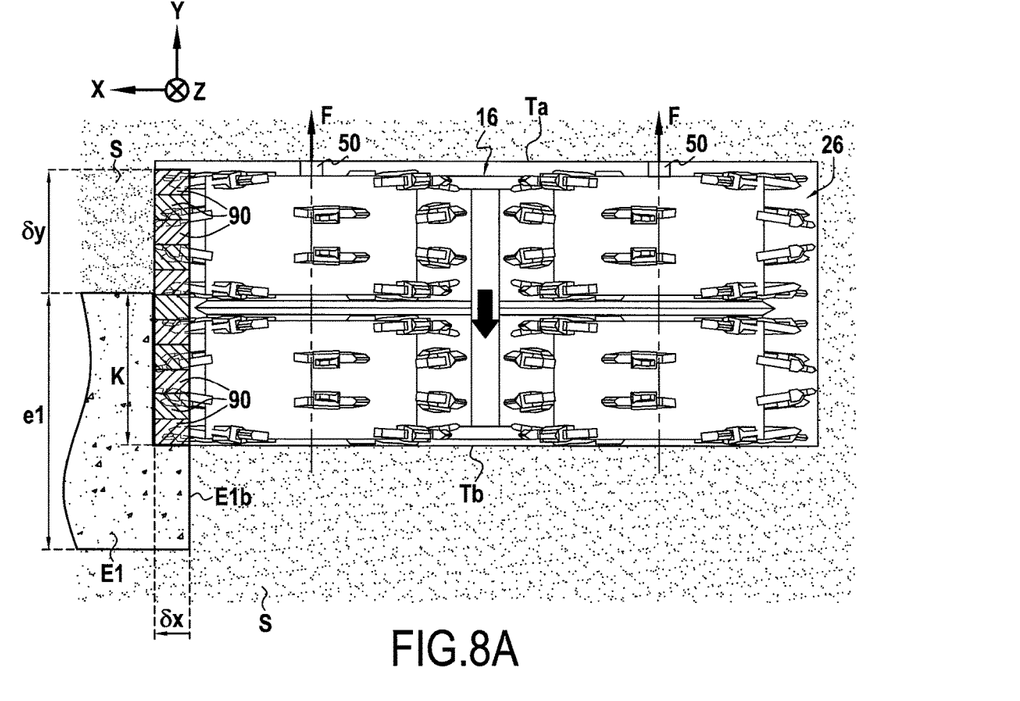
FIG. 8A shows the variant of the FIG. 6A installation, the frame being provided with electrodes for measuring the resistivity of the surrounding medium.
Figure 8B:
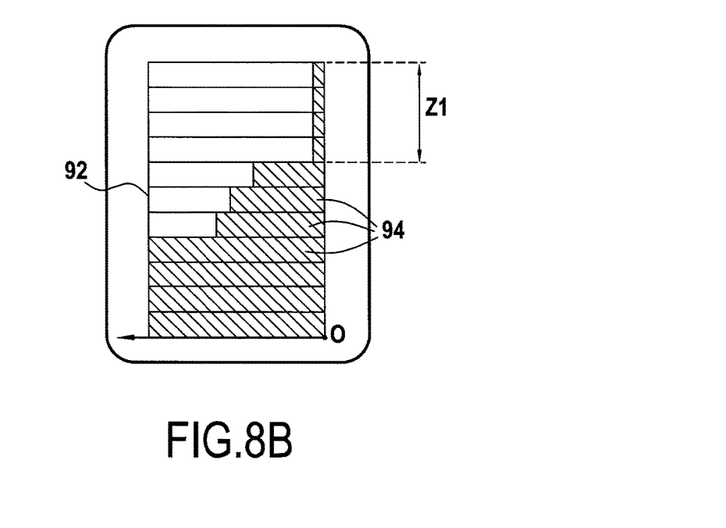
FIG. 8B shows the graphical data that appears on the monitor screen connected to the detectors of FIG. 8A.

With reference to FIGS. 8A and 8B, there follows a description of a third implementation of the method of the invention.

In this third implementation, the longitudinal side 16c of the frame 16 has sensors 90 for acting during the second boring step to measure the electrical resistivity of the medium in contact with the sensors 90. Still in this method, the offset δy between the frame 16 and the first screen is determined from the measurements provided by the sensors 90. These measurements are displayed on a screen 92 in the form of a bar chart in which each of the bars 94 represents the intensity of the electrical resistivity as measured by a respective one of the sensors 90. In this example, it can be seen that there exists a zone Z1 in which the sensors have measured very low resistivity. It can be deduced therefrom, in manual or automatic manner, that the frame has shifted by an offset δy in the Y direction towards the sensors that have measured low resistivity. Once more, the position of the frame 16 is corrected by actuating the bearing skids 50 so as to reduce the offset δy that has been determined.

Figure 9A:
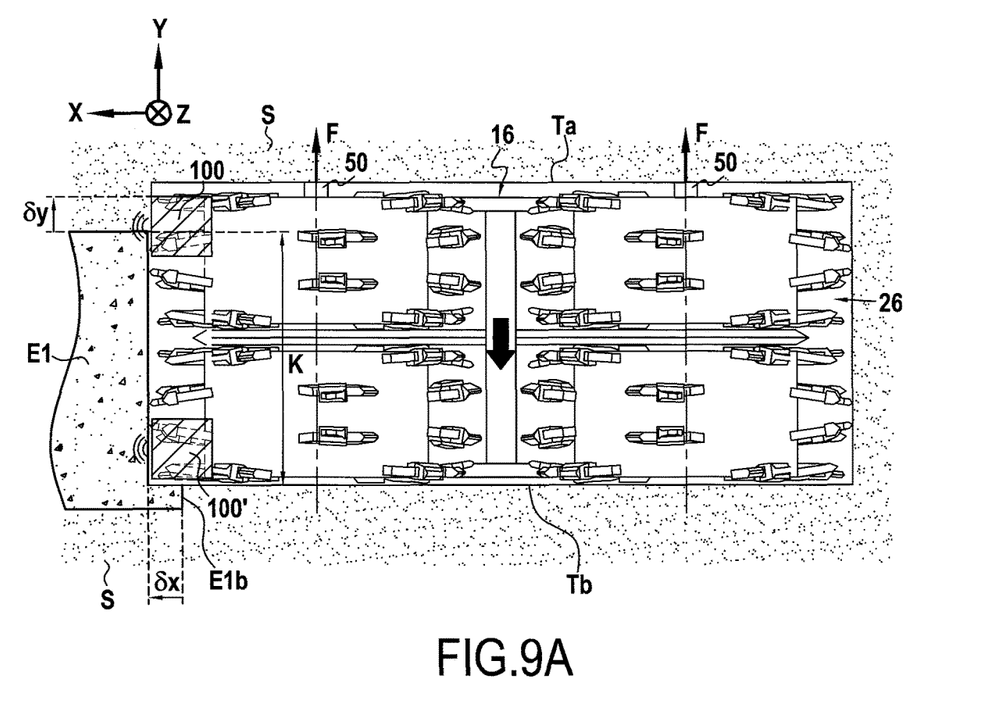
FIG. 9A shows a variant of the FIG. 6A installation, in which the frame is provided with two sonars.
Figure 9B:
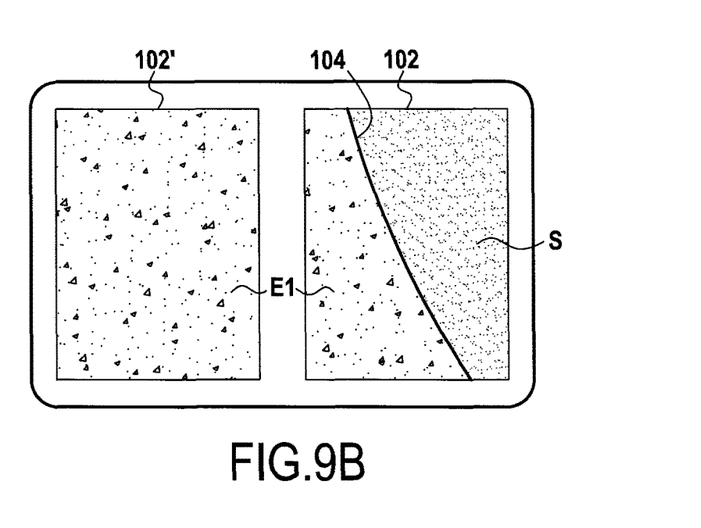
FIG. 9B shows the graphical data that appears on the monitor screen connected to the sonars of the FIG. 9A frame.

With reference to FIGS. 9A and 9B, there follows a description of a fourth implementation of the method of the invention. In this fourth implementation, the frame 16 has wave emitter and receiver sources 100, 100' that are arranged on either side of the thickness of the frame. In this method, during the second boring step, the wave emitter and receiver sources 100, 100' emit waves towards the first screen E1 and then measure the waves as reflected by said first screen E1. The offset δy between the frame and the first screen is determined from the measurements supplied by the wave emitter and receiver sources. In this example, the wave emitter and receiver sources 100, 100' are sonars. The acoustic image obtained from the wave emitter and receiver sources 100, 100' is displayed in the form of images 102, 102'. Unlike the image 102, it can be seen that the image 102' presents a discontinuity 104 that is representative of a discontinuity of the medium. It can be deduced therefrom that the frame has shifted by an offset δy towards the sensor that has served to identify the discontinuity 104. Once more, the position of the frame 16 is corrected by actuating the bearing skids 50 so as to reduce the offset δy that has been determined.

Figure 5:
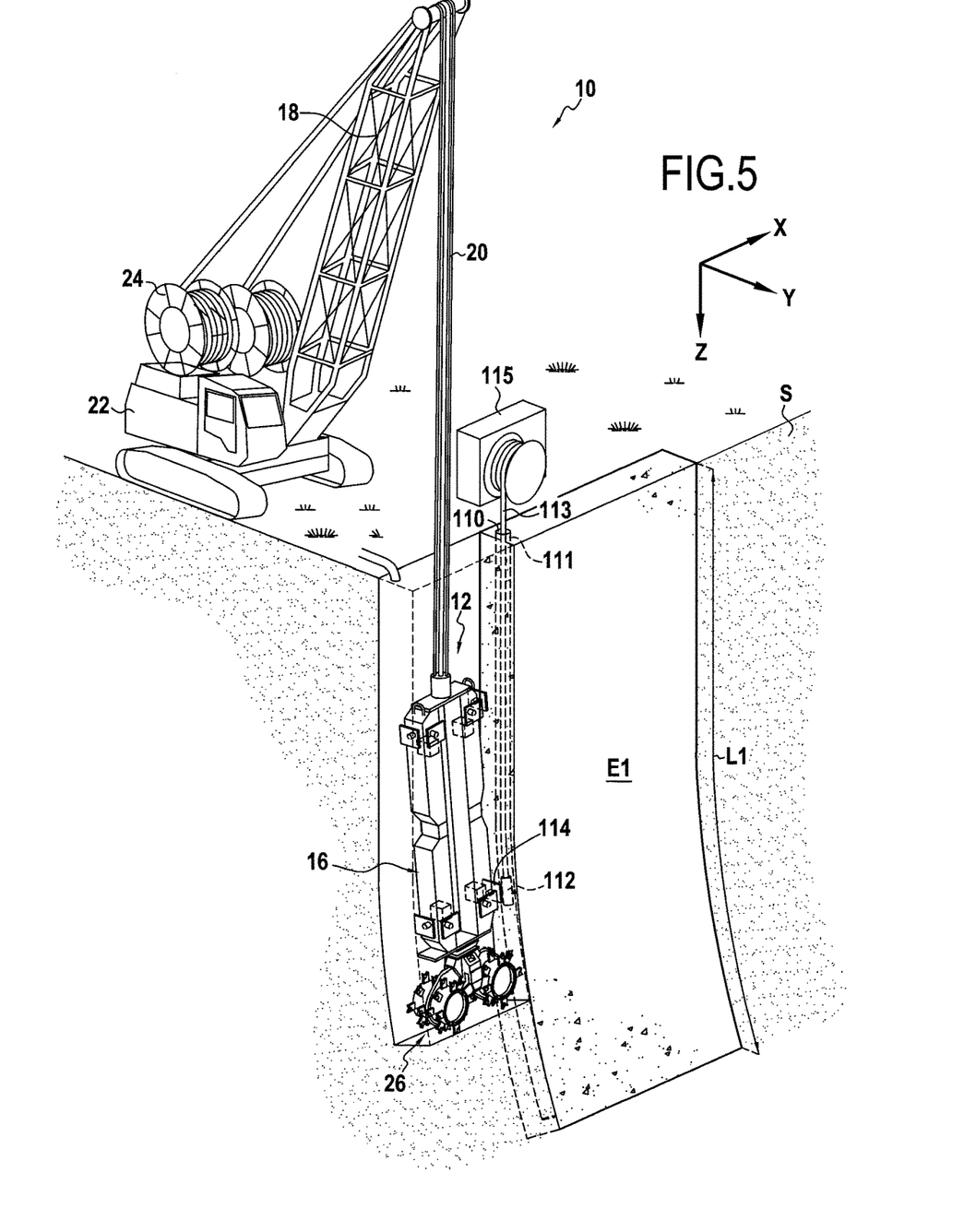
FIG. 5 shows a variant of the FIG. 1 installation performing the method in another implementation, in which a probe is lowered down a longitudinal channel formed in the first screen.

With reference to FIG. 5, there follows a description of a fifth implementation of the invention. In this fifth implementation, at least one longitudinal cavity 110 is provided in the first screen, this longitudinal cavity 110 extending over substantially the entire length L of the first screen. In this method, during the second boring step, an emitter 112 is lowered down the cavity 110 at a speed identical to the downward speed of the frame 16. For this purpose, the emitter 112 may for example be connected to the bottom end of a cable 113, which cable is connected to a motor-driven winder 115 arranged on the surface.

As can be seen in FIG. 5, the frame 16 has a receiver 114. In this example, the receiver 114 is fastened to the longitudinal side of the frame 16. In accordance with the invention, the emitter 112 emits a signal that is received by the receiver 114. Any offset between the frame and the first screen is determined from the signal received by the receiver 114.

Naturally, and without going beyond the ambit of the present invention, it would be possible to interchange the emitter and the receiver.

In this example, the longitudinal cavity 110 is constituted by a hollow part 111 that is placed inside the first screen while it is being made. In this example, the hollow part 111 is constituted by a tube. Furthermore, the XYZ position of the cavity in the first screen E1 is known.

In a sixth implementation, this longitudinal cavity described with reference to FIG. 5 is not provided in the first screen E1, but instead in the ground in the vicinity of the first screen E1. Its XYZ position is known. In this variant, during the second boring step, an emitter (or a receiver as the case may be) is lowered down the cavity at a speed identical to the downward speed of the frame, said frame being fitted with a receiver (or an emitter as the case may be). In similar manner to the fifth implementation of the invention, the emitter emits a signal that is received by the receiver. Once more, the offset between the frame 16 and the first screen E1 is determined from the signal received by the receiver. In similar manner to the other implementations, the position of the frame 16 is corrected by actuating the bearing skids 50. A plurality of cavities are preferably used each having an emitter (or a receiver as the case may be) lowered inside it, with this being for the purpose of improving the measurements.

The invention claimed is:

1. A method of making a continuous wall in ground, the method comprising:
   providing an excavation machine having a frame with a longitudinal direction, said frame having a bottom end and carrying a cutter device fixedly coupled with the bottom end;
   forming a first screen in the ground, the forming including a first vertical boring step using the excavation machine; and
   performing a second vertical boring step using the excavation machine in order to make a second screen in the ground that is juxtaposed with the first screen such that the first and second screens are secant;
   wherein, the second vertical boring step includes:
      determining an offset between the frame and the first screen; and
      correcting the position of the frame should the offset be beyond a predetermined threshold, so as to reduce the previously determined offset and maintain overlap between a longitudinal side of the frame and a longitudinal side of the first screen, such that the second screen is secant with the first screen over an entire length of the shorter of the first and second screens, thereby forming the continuous wall.

2. The method according to claim 1, wherein, during the second vertical boring step, a physical magnitude is measured periodically, and in that the offset between the frame and the first screen is determined from a plurality of measured values of said physical magnitude.

3. The method according to claim 2, wherein the measured physical magnitude is an electric potential, an electric field, an electromagnetic field, or a magnetic field.

4. The method according to claim 1, comprising placing at least one electrode in the first screen, and during the second vertical boring step, measuring a physical magnitude at least from the longitudinal side of the frame that faces the longitudinal side of the first screen, and determining the offset between the frame and the first screen from the measured physical magnitude values.

5. The method according to claim 4, comprising placing a plurality of electrodes in the first screen, the electrodes being arranged in a row that extends across a thickness of the first screen, and wherein the electrodes are set to at least one predetermined potential.

6. The method according to claim 1, wherein the first screen is made from a mixture of hydraulic binder and a marker, and wherein, during the second vertical boring step, the presence of the marker is detected by using at least one detector arranged in the frame, and wherein the offset between the frame and the first screen is determined from values supplied by the detector.

7. The method according to claim 6, wherein the longitudinal side of the frame is provided with at least one strip of detectors that extend at least across a thickness of the frame.

8. The method according to claim 1, wherein at least one metal part is placed in the first screen while it is being made, said at least one metal part extending along the length of the first screen, wherein the frame is provided with a measuring appliance, and wherein, during the second vertical boring step, the offset between the frame and the first screen is determined from values measured by the measuring appliance.

9. The method according to claim 8, comprising placing a plurality of metal parts in the first screen, the metal parts being arranged in a row that extends across the thickness of the first screen, and wherein the metal parts are set to a predetermined potential.

10. The method according to claim 1, wherein the longitudinal side of the frame is provided with sensors configured to, during the second vertical boring step, measure the electrical resistivity or the mechanical strength of the medium in contact with the sensors, and wherein the offset between the frame and the first screen is determined from the measurements supplied by the sensors.

11. The method according to claim 1, wherein the frame includes wave emitter and receiver sources that are arranged on either side of the thickness of the frame, wherein, during the second vertical boring step, the wave emitter and receiver sources emit waves towards the first screen and then measure the reflected waves, and wherein the offset between the frame and the first screen is determined from the measurements supplied by the wave emitter and receiver sources.

12. The method according to claim 1, wherein at least one longitudinal cavity is arranged in the first screen, and wherein, during the second vertical boring step, an emitter or a receiver is lowered down the cavity at a speed identical to the downward speed of the frame, said frame being fitted with the other of a receiver or an emitter, wherein the emitter emits a signal that is received by the receiver, and wherein the offset between the frame and the first screen is determined from the signal received by the receiver.

13. The method according to claim 12, wherein the longitudinal cavity is constituted by a hollow part placed in the first screen while it is being made.

14. The method according to claim 1, wherein at least one longitudinal cavity is arranged in the ground in the vicinity of the first screen, and wherein during the second vertical boring step, an emitter or a receiver be is lowered down the cavity at a speed identical to the downward speed of the frame, said frame being fitted with the other of a receiver or an emitter, wherein the emitter emits a signal that is received by the receiver and wherein the offset between the frame and the first screen is measured from the signal received by the receiver.

15. An installation for making a continuous wall in ground, the installation comprising:
   an assembly configured to make first and second screens in the ground, which assembly comprises an excavation machine having a frame with a bottom end and carrying a cutter device fixedly coupled with the bottom end;
   a determination device configured to determine the offset between the frame and the first screen while making the second screen in the ground; and
   a correction device configured to correct the position of the frame should the offset be beyond a predetermined threshold, so as to reduce the offset as determined by the determination device between the frame and the first screen, and maintain overlap between a longitudinal side of the frame and a longitudinal side of the first screen such that the second screen is secant with the first screen over the entire length of the shorter of the first and second screens, thereby forming the continuous wall.

16. A method of making a continuous wall in ground, the method comprising:
   providing an excavation machine having a frame with a longitudinal direction, said frame having a bottom end and carrying a cutter device arranged at the bottom end;
   forming a first screen in the ground, the forming including a first vertical boring step by displacing the excavation machine vertically; and
   performing a second vertical boring step by moving the excavation machine vertically in order to make a second screen in the ground that is juxtaposed with the first screen, the second vertical boring step being performed while biting into the first screen, such that the first and second screens are secant;
   wherein, the second vertical boring step includes:
      determining an offset between the frame and the first screen at different depth; and
      correcting the position of the frame should the offset be beyond a predetermined threshold, so as to reduce the previously determined offset and maintain overlap between a longitudinal side of the frame and a longitudinal side of the first screen, such that the second screen is secant with the first screen over an entire length of the shorter of the first and second screens, thereby forming the continuous wall.

17. A method of making a continuous wall in ground, the method comprising:
   providing an excavation machine having a frame with a longitudinal direction, said frame having a bottom end and carrying a cutter device arranged at the bottom end;
   breaking ground by forming a first screen in the ground, the forming including a first vertical boring step using the excavation machine; and
   performing a second vertical boring step using the excavation machine in order to make a second screen in the ground that is juxtaposed with the first screen, such that the first and second screens are secant;
   wherein the second vertical boring step includes:
      determining an offset between the frame and the first screen; and
      correcting the position of the frame should the offset be beyond a predetermined threshold, so as to reduce the previously determined offset and maintain overlap between a longitudinal side of the frame and a longitudinal side of the first screen, such that the second screen is secant with the first screen over an entire length of the shorter of the first and second screens, thereby forming the continuous wall.

* * * * *